United States Patent
Voelkel et al.

(10) Patent No.: US 7,126,398 B1
(45) Date of Patent: Oct. 24, 2006

(54) METHOD AND AN APPARATUS TO GENERATE STATIC LOGIC LEVEL OUTPUT

(75) Inventors: Eric H. Voelkel, Ben Lomond, CA (US); Robert M. Reinschmidt, Hollis, NH (US); Greg J. Landry, Merrimack, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 51 days.

(21) Appl. No.: 11/012,610

(22) Filed: Dec. 14, 2004

Related U.S. Application Data

(60) Provisional application No. 60/530,552, filed on Dec. 17, 2003.

(51) Int. Cl.
*H03K 3/037* (2006.01)

(52) U.S. Cl. ............... 327/199; 327/208; 327/215
(58) Field of Classification Search ........ 327/198–200, 327/208–210, 214, 225; 326/104
See application file for complete search history.

(56) References Cited

U.S. PATENT DOCUMENTS

| | | | | |
|---|---|---|---|---|
| 4,806,786 A * | 2/1989 | Valentine | | 327/203 |
| 5,391,941 A | 2/1995 | Landry | | 326/106 |
| 5,490,115 A | 2/1996 | Shah et al. | | 365/201 |
| 5,835,970 A | 11/1998 | Landry et al. | | 711/218 |
| 5,903,174 A | 5/1999 | Landry et al. | | 327/162 |
| 5,933,032 A | 8/1999 | Shah et al. | | 327/34 |
| 5,943,241 A | 8/1999 | Nichols et al. | | 326/105 |
| 5,986,490 A * | 11/1999 | Hwang et al. | | 327/202 |
| 6,028,448 A | 2/2000 | Landry | | 326/58 |
| 6,043,684 A | 3/2000 | Landry | | 326/98 |
| 6,088,289 A | 7/2000 | Landry et al. | | 365/230.06 |
| 6,119,249 A | 9/2000 | Landry | | 714/718 |
| 6,134,181 A | 10/2000 | Landry | | 365/233 |
| 6,172,519 B1 * | 1/2001 | Chiang et al. | | 326/38 |
| 6,208,186 B1 * | 3/2001 | Nair | | 327/199 |
| 6,222,393 B1 | 4/2001 | Shah et al. | | 327/34 |
| 6,298,005 B1 | 10/2001 | Landry | | 365/233 |
| 6,333,891 B1 | 12/2001 | Landry et al. | | 365/230.06 |
| 6,411,140 B1 | 6/2002 | Landry | | 327/141 |
| 6,466,505 B1 | 10/2002 | Landry | | 365/219 |
| 6,486,712 B1 | 11/2002 | Landry et al. | | 327/99 |
| 6,507,932 B1 | 1/2003 | Landry et al. | | 716/3 |
| 6,515,884 B1 | 2/2003 | Sywyk et al. | | 365/49 |
| 6,549,050 B1 * | 4/2003 | Meyers et al. | | 327/217 |
| 6,563,437 B1 | 5/2003 | Landry et al. | | 341/51 |
| 6,611,935 B1 | 8/2003 | Landry | | 714/736 |
| 6,647,457 B1 | 11/2003 | Sywyk et al. | | 711/108 |
| 6,657,472 B1 * | 12/2003 | Raza et al. | | 327/217 |
| 6,697,275 B1 | 2/2004 | Sywyk et al. | | 365/49 |
| 6,751,755 B1 | 6/2004 | Sywyk et al. | | 714/54 |
| 6,975,151 B1 * | 12/2005 | Akiyoshi | | 327/199 |

* cited by examiner

*Primary Examiner*—Timothy P. Callahan
*Assistant Examiner*—Hai L. Nguyen
(74) *Attorney, Agent, or Firm*—Blakely Sokoloff Taylor & Zafman LLP

(57) ABSTRACT

A method and an apparatus to generate static logic level outputs without a direct connection from a MOS transistor gate to either a power supply or ground supply are described. The apparatus may include a first circuit comprising a static logic level output. The apparatus may further include a second circuit coupled to the first circuit to drive the first circuit. The second circuit may comprise at least one of a latch and a feedback device.

14 Claims, 7 Drawing Sheets

--Prior Art--

--Prior Art--

US 7,126,398 B1

METHOD AND AN APPARATUS TO GENERATE STATIC LOGIC LEVEL OUTPUT

REFERENCE TO RELATED APPLICATION

This application claims the benefit of U.S. Provisional Application No. 60/530,552, filed on Dec. 17, 2003.

TECHNICAL FIELD

The present invention relates generally to integrated circuits (ICs), and more particularly, to generating static logic level outputs in ICs.

BACKGROUND

In general, static logic level circuits are circuits that provide one or more constant logic outputs, including static logic one and static logic zero. These constant logic outputs are also known as static logic level outputs. Static logic level outputs are typically used in ICs as tie-offs for input terminals of logic gates not driven by any other driving device or driving signal, except the static logic level outputs. Note that some IC designers refer to these input terminals as "unused" input terminals. Furthermore, in some IC designs, gates that are specified to be coupled to a logic one or a logic zero may be coupled to the corresponding static logic level output.

In general, an indirect connection (also known as a "soft" connection) to a static logic one or a static logic zero is preferred because a direct connection of a gate to a power supply or ground may cause Electro-Static Discharge (ESD) failures in the IC. This is especially serious with some advanced technologies because the devices may have relatively thin gate oxide, and hence, are more susceptible to ESD.

Four conventional circuits for providing a static logic one or a static logic zero are shown in FIGS. 1A and 1B and in FIGS. 2A and 2B. The circuit 101 shown in FIG. 1A uses a diode-connected transistor 110 to provide an intermediate voltage to drive the gate of the n-type Metal Oxide Semiconductor (NMOS) transistor 120, which in turn generates a static logic zero. Likewise, the circuit 102 shown in FIG. 1B uses a diode-connected transistor 112 to provide an intermediate voltage to drive the gate of the p-type Metal Oxide Semiconductor (PMOS) transistor 122, which in turn generates a static logic one.

The circuits 201 and 202 shown in FIGS. 2A and 2B are similar to those in FIGS. 1A and 1B. However, instead of using a diode-connected transistor, each of the circuits 201 and 202 uses a resistor instead. Referring to FIG. 2A, one end of the resistor 210 is coupled to a power supply and the other end is coupled to the gate of the NMOS transistor 220 to drive the NMOS transistor 220. Likewise, one end of the resistor 212 in FIG. 2B is grounded and the other end is coupled to the gate of the pMOS transistor 222 to drive the pMOS transistor 222. As a result, the intermediate nodes, Int, in both circuits 201 and 202 are driven to a full power supply or rail value.

One disadvantage of the conventional circuits 101 and 102 is that the intermediate nodes, Int, may not be at the full rail logic level, and hence, the voltages at the intermediate nodes may not drive the transistors 120 and 122 as strongly as if the intermediate nodes were at the full rail logic level. Consequently, the transistors 120 and 122 may be at the edge of "cutoff."

Another disadvantage of the conventional circuits 101 and 102 is their susceptibility to crosstalk. Crosstalk generally refers to noise events that may cause the static logic level output to switch to an undesired logic state for some period of time during the noise events. The circuits 101 and 102 rely on a high impedance node that is not at the full power supply rail voltage (e.g., the intermediate node, Int) to drive the gate of a transistor. This is problematic when the transistor threshold voltage (Vt) becomes large relative to the power supply. If the Vt of the transistors 120 and 122 is too large relative to the power supply, then the voltage at the intermediate node, Int, may not be strong enough to activate the transistors 120 and 122 sufficiently to achieve a good drive strength in the static logic level outputs. This condition, along with the high-impedance nature of the intermediate node, leads to crosstalk susceptibility.

A disadvantage of the second type of conventional circuits 201 and 202 in FIGS. 2A and 2B is that the resistors 210 and 212 typically occupy a large amount of area on a die in order to effectively prevent ESD failures, and thus, resulting in a large area penalty. Moreover, since the required resistance of the resistors 210 and 212 is usually large (e.g., about 1 Kohms or higher), the intermediate node, Int, in FIGS. 2A and 2B will be in a relatively high impedance state. Thus, the noise issues associated with crosstalk discussed above may apply to the circuits 201 and 202 as well.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

In one embodiment, a first circuit is driven by a second circuit to generate a static logic level output, which may include a static logic zero or a static logic one. The second circuit may include a latch that generates two opposite outputs, which are input to the first circuit to cause the first circuit to generate a static logic level output. Alternatively, the second circuit may include a feedback device to provide a feedback signal from an output of the first circuit to an input of the first circuit. A voltage at an intermediate node of the first circuit may be pulled up in response to the feedback signal to reduce the impedance at the intermediate node. In some embodiments, the voltage at the intermediate node drives a transistor in the first circuit to generate a static logic level output.

Figure 3A:
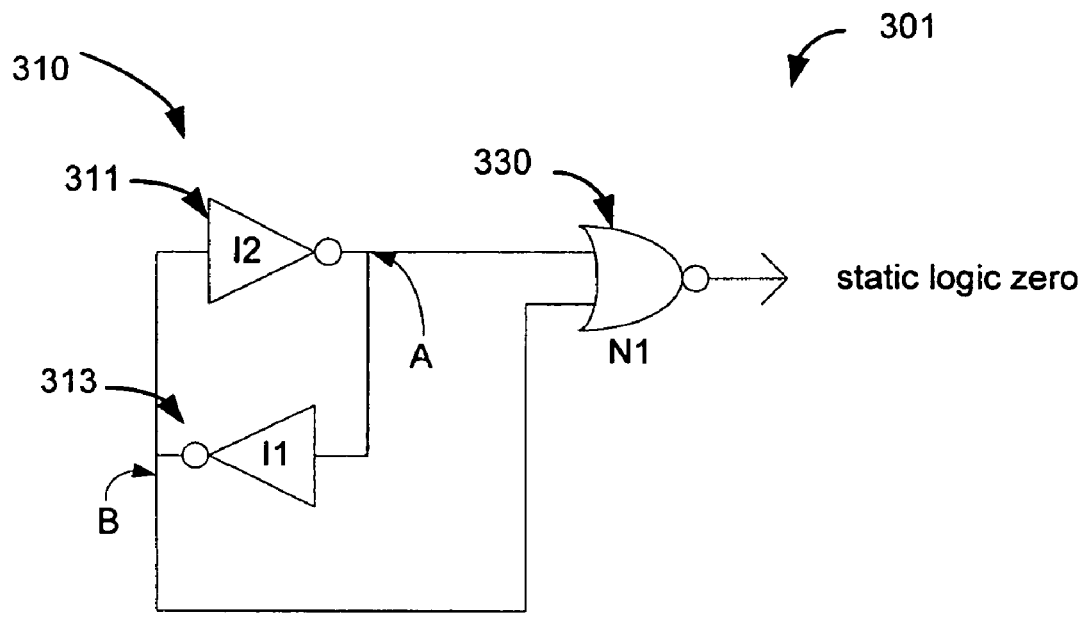
FIG. 3A shows one embodiment of a circuit to output a static logic zero.

FIG. 3A shows one embodiment of a circuit to generate a static logic level zero. The circuit 301 includes a latch 310 and a NOR gate 330. The latch 310 may include a first inverter 311 and a second inverter 313. The input of the first inverter 311 is coupled to the output of the second inverter 313. Likewise, the input of the second inverter 313 is coupled to the output of the first inverter 311. The outputs of the first and the second inverters 311 and 313 are input to the NOR gate 330.

In one embodiment, the state of the latch 310 is indeterminate at power up. However, the latch 310 will resolve its state in one direction or the other. Once the latch 310 resolves its state, no matter which logic state the latch 310 resolves to, the two outputs of the latch 310 oppose each other. The two outputs of the latch 310, including a logic one and a logic zero, are input to the NOR gate 330, to cause the NOR gate 330 to generate a static logic zero.

For example, assume that node "A" in FIG. 3A resolves to a logic zero while node "B" resolves to a logic one. Since one of the inputs to the NOR gate 330 is a logic one (node "B"), the output of the NOR gate 330 is a logic zero. Conversely, if the latch 310 resolves to the opposite state, node "A" becomes a logic one and node "B" becomes a logic zero. Inputting a logic one and a logic zero to the NOR gate 330 still causes the NOR gate to output a logic zero. Therefore, the output of the NOR gate 330 is a static logic zero.

Figure 3B:
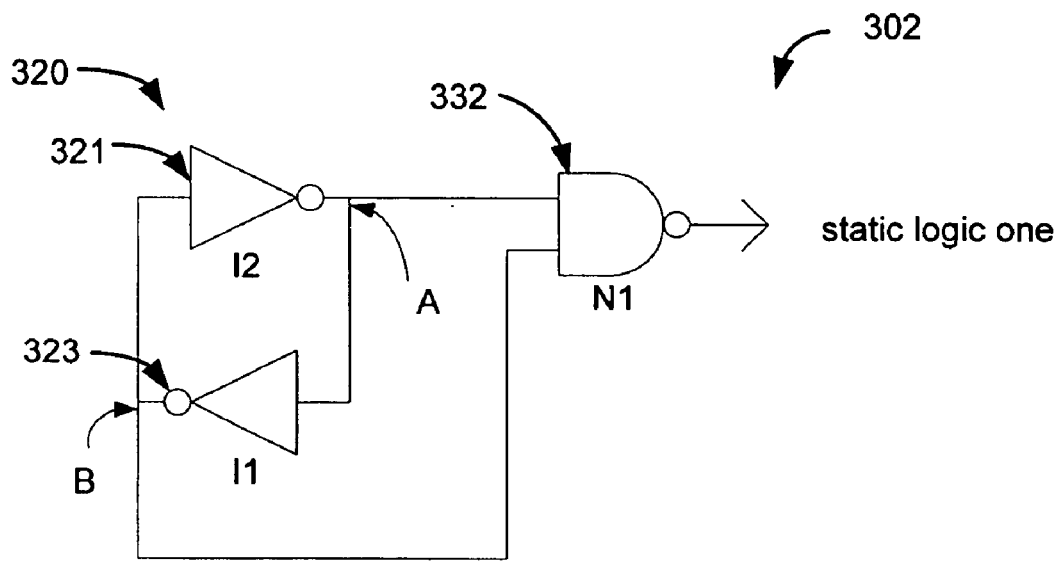
FIG. 3B shows one embodiment of a circuit to output a static logic one.

FIG. 3B shows one embodiment of a circuit to generate a static logic one. The circuit 302 includes a latch 320 and a NAND gate 332. The latch 320 may include a first inverter 321 and a second inverter 323. The input of the first inverter 321 is coupled to the output of the second inverter 323. Likewise, the input of the second inverter 323 is coupled to the output of the first inverter 321. The outputs of the first and the second inverters 321 and 323 are input to the NAND gate 332.

In one embodiment, the state of the latch 320 is indeterminate at power up. However, the latch 320 will resolve its state in one direction or the other. Once the latch 320 resolves its state, no matter which logic state the latch 320 resolves to, the two outputs of the latch 320 oppose each other. The two outputs of the latch 320, including a logic one and a logic zero, are input to the NAND gate 332, to cause the NAND gate 332 to generate a static logic one.

For example, assume that node "A" in FIG. 3B resolves to a logic zero while node "B" resolves to a logic one. Since one of the inputs to the NAND gate 332 is a logic zero (node "A"), the output of the NAND gate 332 is a logic one. Conversely, if the latch 320 resolves to the opposite state, node "A" becomes a logic one and node "B" becomes a logic zero. Inputting a logic one and a logic zero to the NAND gate 332 still causes the NAND gate to output a logic one. Therefore, the output of the NAND gate 332 is a static logic one.

Alternatively, instead of separately implementing the circuits 301 and 302 in FIGS. 3A and 3B, respectively, the two circuits 301 and 302 may be combined. In one embodiment, the NAND gate 332 and the NOR gate 330 may be coupled in parallel to a common latch to generate a static logic one and a static logic zero, respectively. By sharing a common latch, both static logic one and static logic zero may be generated using a single circuit while the total number of devices is reduced to save more die area.

Figure 4A:
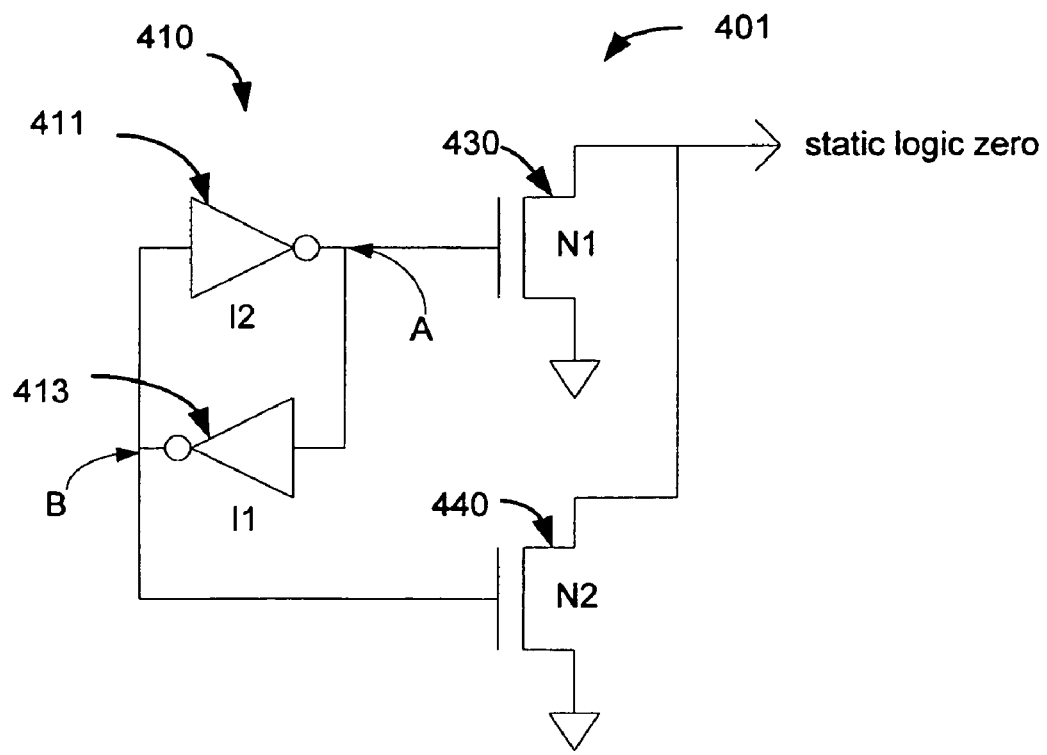
FIG. 4A shows an alternative embodiment of a circuit to output a static logic zero.

FIG. 4A shows an alternative embodiment of a circuit to generate a static logic zero. The circuit 401 includes a latch 410, a first n-type Metal Oxide Semiconductor (nMOS) transistor 430, and a second nMOS transistor 440. The latch 410 may include a first inverter 411 and a second inverter 413. The output of the first inverter 411 is coupled to the input of the second inverter 413. Likewise, the output of the second inverter 413 is coupled to the input of the first inverter 411. The output of the first inverter 411 is further coupled to the gate of the first nMOS transistor 430. Likewise, the output of the second inverter 413 is further coupled to the gate of the second NMOS transistor 440. The source terminals of both NMOS transistors 430 and 440 are coupled to ground.

As discussed above with reference to FIGS. 3A and 3B, the latch 410 resolves its state to produce two opposing outputs, including a high voltage and a low voltage. One of the two outputs drives the gate of the first nMOS transistor 430 while the other output drives the gate of the second NMOS transistor 440. An NMOS transistor is activated when driven by a high voltage and is deactivated when driven by a low voltage. Therefore, one of the two opposing outputs from the latch 410 activates one of the nMOS transistors 430 and 440 and the other output deactivates the other nMOS transistor. The activated nMOS transistor (430 or 440) generates a logic zero at the drain of the activated nMOS transistor while the deactivated nMOS transistor (440 or 430) shuts off. Since either one of the two nMOS transistors (430 and 440) is always activated when the circuit 401 is in operation, the circuit 401 generates a static logic zero.

Figure 4B:
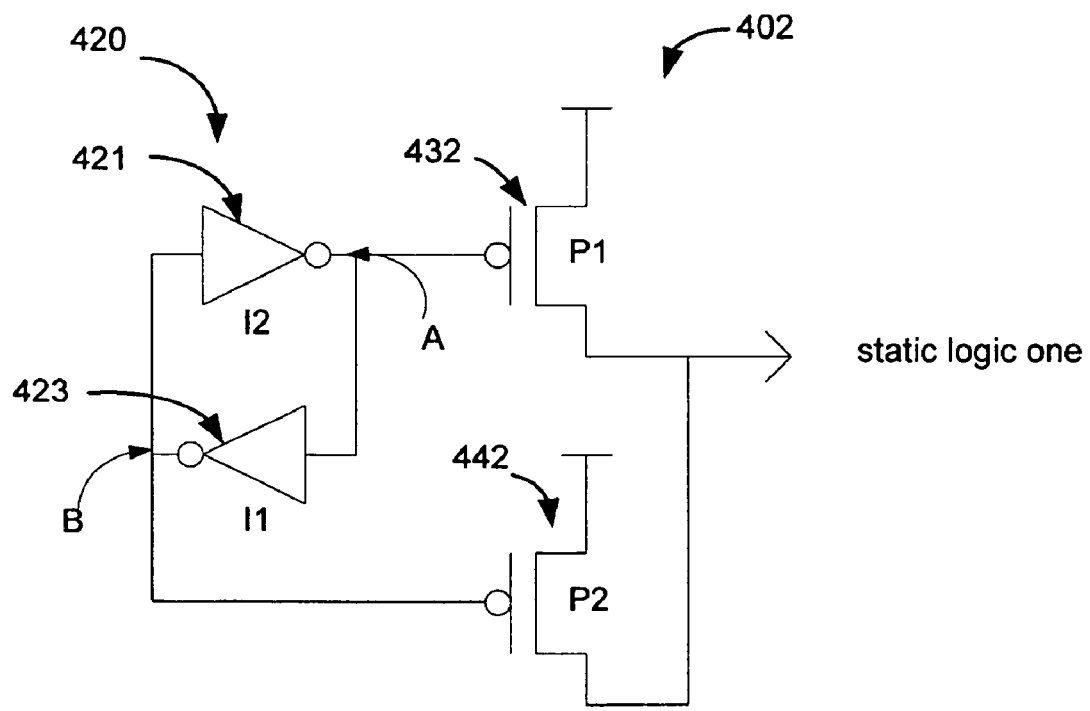
FIG. 4B shows an alternative embodiment of a circuit to output a static logic one.

FIG. 4B shows an alternative embodiment of a circuit to generate a static logic one. The circuit 402 includes a latch 420, a first p-type Metal Oxide Semiconductor (pMOS) transistor 432, and a second pMOS transistor 442. The latch 420 may include a first inverter 421 and a second inverter 423. The output of the first inverter 421 is coupled to the input of the second inverter 423. Likewise, the output of the second inverter 423 is coupled to the input of the first inverter 421. The output of the first inverter 421 is further coupled to the gate of the first pMOS transistor 432. Likewise, the output of the second inverter 423 is further coupled to the gate of the second pMOS transistor 442. The source terminals of both pMOS transistors 432 and 442 are coupled to a power supply.

As discussed above with reference to FIGS. 3A and 3B, the latch 420 resolves its state to produce two opposing outputs, including a high voltage and a low voltage. One of the two outputs drives the gate of the first pMOS transistor 432 while the other output drives the gate of the second pMOS transistor 442. A pMOS transistor is activated when driven by a low voltage and is deactivated when driven by a high voltage. Therefore, one of the two opposing outputs from the latch 420 activates one of the pMOS transistors 432 and 442 and the other output deactivates the other pMOS transistor. The activated pMOS transistor (432 or 442) generates a logic one at the drain of the activated pMOS transistor while the deactivated pMOS transistor (442 or 432) shuts off. Since either one of the two pMOS transistors (432 and 442) is always activated when the circuit 402 is in operation, the circuit 402 generates a static logic one.

Alternatively, instead of separately implementing the circuits 401 and 402 in FIGS. 4A and 4B, respectively, the two circuits 401 and 402 may be combined. In one embodiment, the pair of pMOS transistors 432 and 442 and the pair of nMOS transistors 430 and 440 may be coupled in parallel to a common latch to generate a static logic one and a static logic zero, respectively. By sharing a common latch, both static logic one and static logic zero may be generated using a single circuit while the total number of devices is reduced to save more die area.

Although described with reference to some exemplary embodiments, one should appreciate that other alternative embodiments of the circuit of the present invention are possible. For example, in each of the embodiments described above, both static logic zero and static logic one may be generated from a single circuit by including additional devices. In the case of a circuit that generates a static logic zero (e.g., circuit 301 in FIG. 3A and circuit 401 in FIG. 4A), a static logic one can be generated using an inverter or a pMOS transistor with the gate of the pMOS transistor coupled to the static logic zero and the source of the pMOS transistor coupled to the power supply such that the drain of the pMOS transistor generates a static logic one. Likewise, in the case of a circuit that generates a static logic one (e.g., circuit 302 in FIG. 3B and circuit 402 in FIG. 4B), a static logic zero can be generated using an inverter or an nMOS transistor with the gate of the NMOS transistor coupled to the static logic one and the source of the nMOS transistor coupled to ground such that the drain outputs a static logic zero. In summary, the circuits to generate a static logic zero and a static logic one may or may not be implemented separately according to different embodiments of the present invention.

Figure 5A:
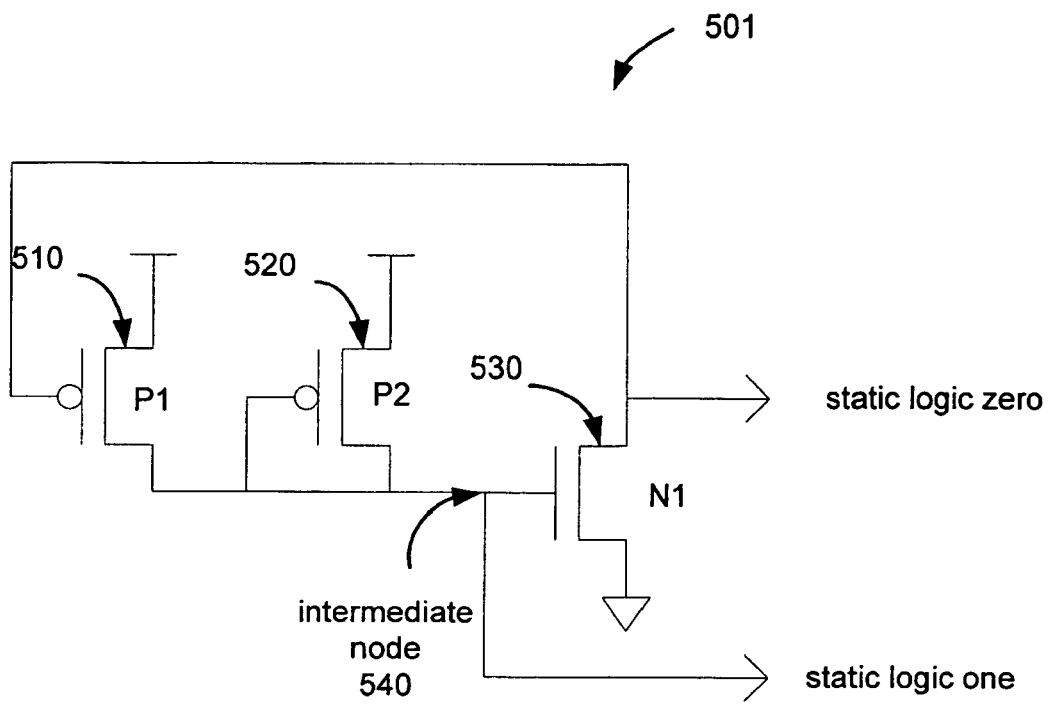
FIG. 5A shows one embodiment of a circuit to output a static logic zero.

FIG. 5A shows one embodiment of a circuit to generate a static logic zero and a static logic one. The circuit 501 includes a first pMOS transistor 510, a second pMOS transistor 520, and an nMOS transistor 530. The gate of the second pMOS transistor 520 is coupled to the drain of the second pMOS transistor 520 to form a diode. The gate of the second pMOS transistor 520 is further coupled to the gate of the nMOS transistor 530. The drain of the nMOS transistor 530 is coupled to the gate of the first pMOS transistor 510 and the source of the NMOS transistor 530 is grounded. The drain of the first pMOS transistor 510 is coupled to the gates of the second pMOS transistor 520 and the NMOS transistor 530. The source of the first and second pMOS transistors 510 and 520 are coupled to a power supply.

Figure 1A:
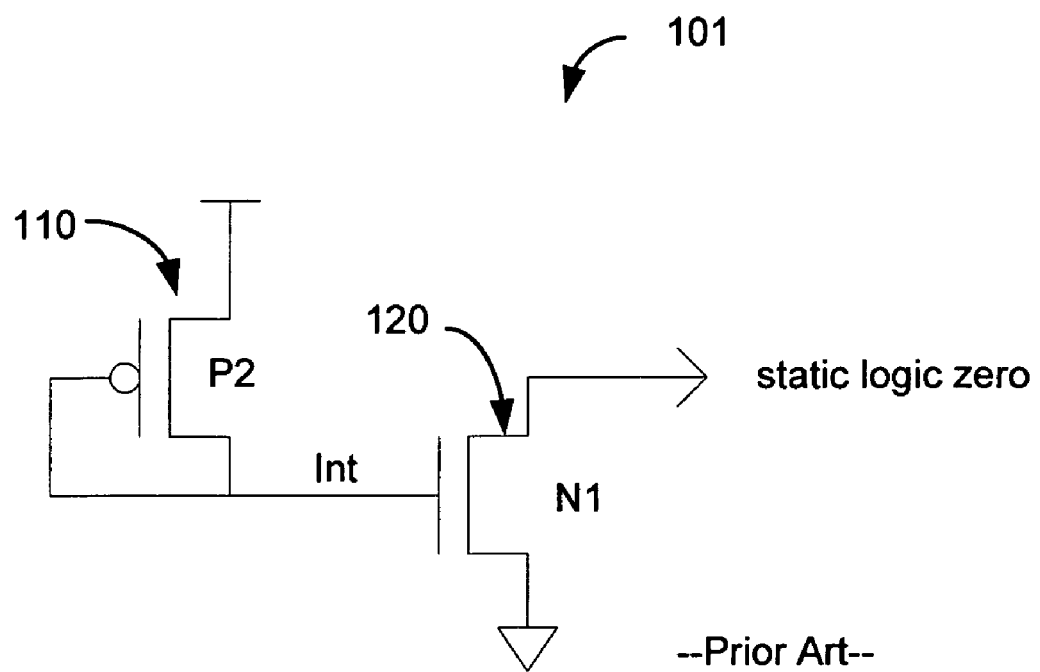
FIGS. 1A and 1B show some conventional circuits to provide a static logic one or a static logic zero.
Figure 1B:
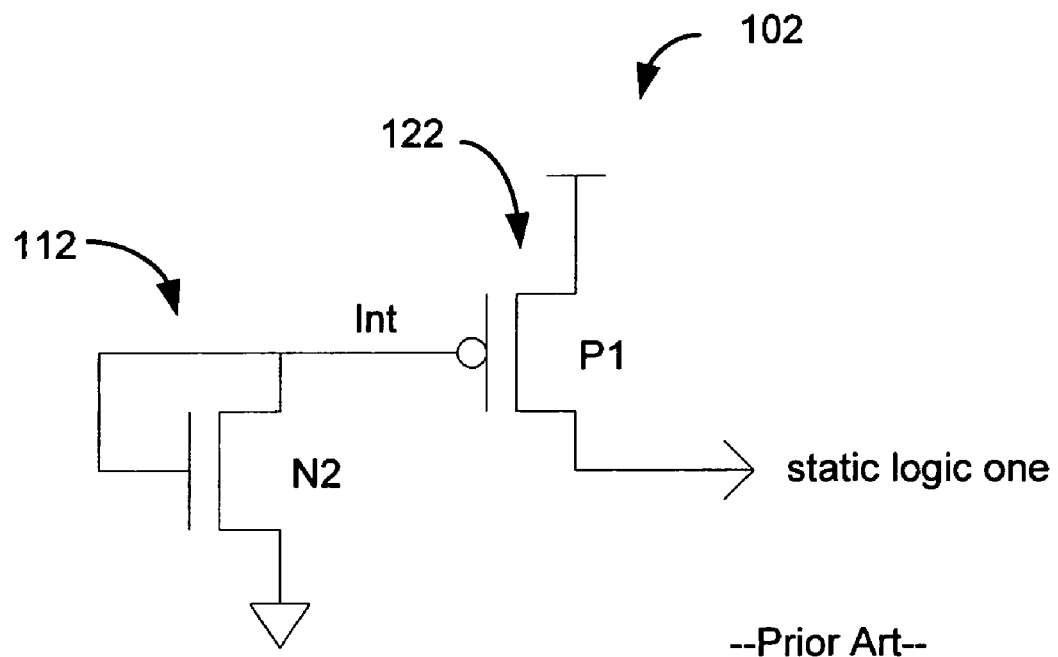
Figure 2A:
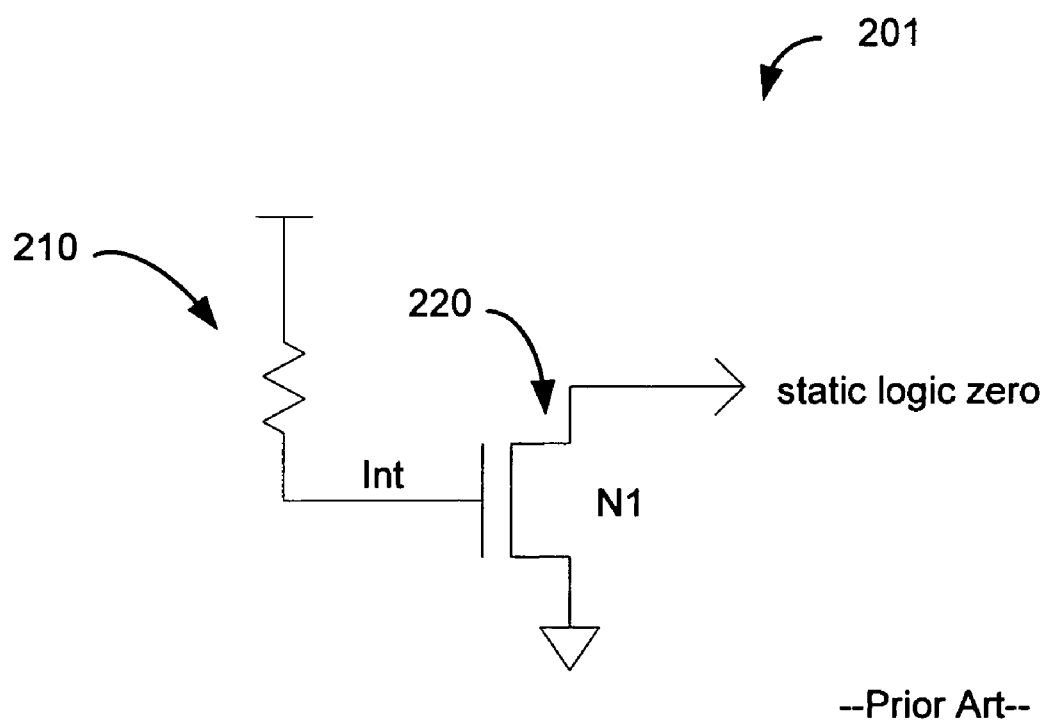
FIGS. 2A and 2B show some conventional circuits to provide a static logic one or a static logic zero.
Figure 2B:
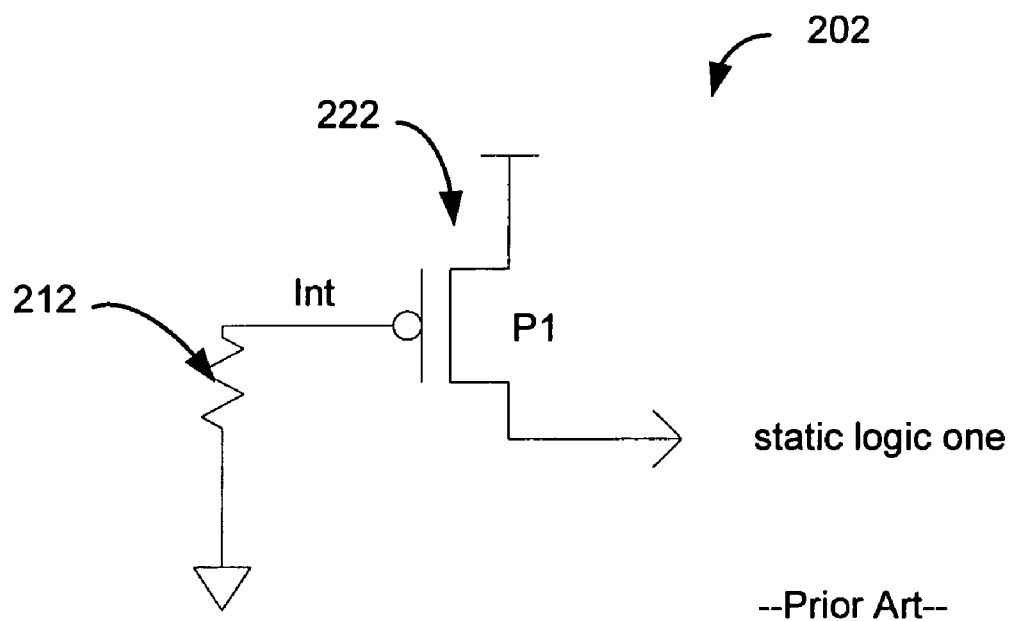

In one embodiment, coupling the drain of the NMOS transistor 530 to the gate of the first pMOS transistor 510 allows the first pMOS transistor 510 to provide a positive feedback to the NMOS transistor 530. Furthermore, the diode-connected pMOS 520 may pull an intermediate node 540 up above the logic zero level. Thus, the impedance of the intermediate node 540 may be less than the impedance of the intermediate node in the conventional circuits shown in FIGS. 1A and 1B.

Moreover, the positive feedback arrangement provides several advantages over some conventional static logic level circuits. One advantage is that the positive feedback arrangement eliminates high-impedance non-CMOS level signals in the circuit 501, and thus, reduces the detrimental effects of crosstalk. Furthermore, the circuit 501 generates both a static logic zero and a static logic one using fewer devices compared with some conventional circuits. Moreover, the circuit 501 reduces the likelihood of Electro-Static Discharge (ESD) by providing a static logic level output to the input terminals of logic gates not driven by any other driving device or driving signal without directly coupling such input terminals to either the ground or the power supply.

Figure 5B:
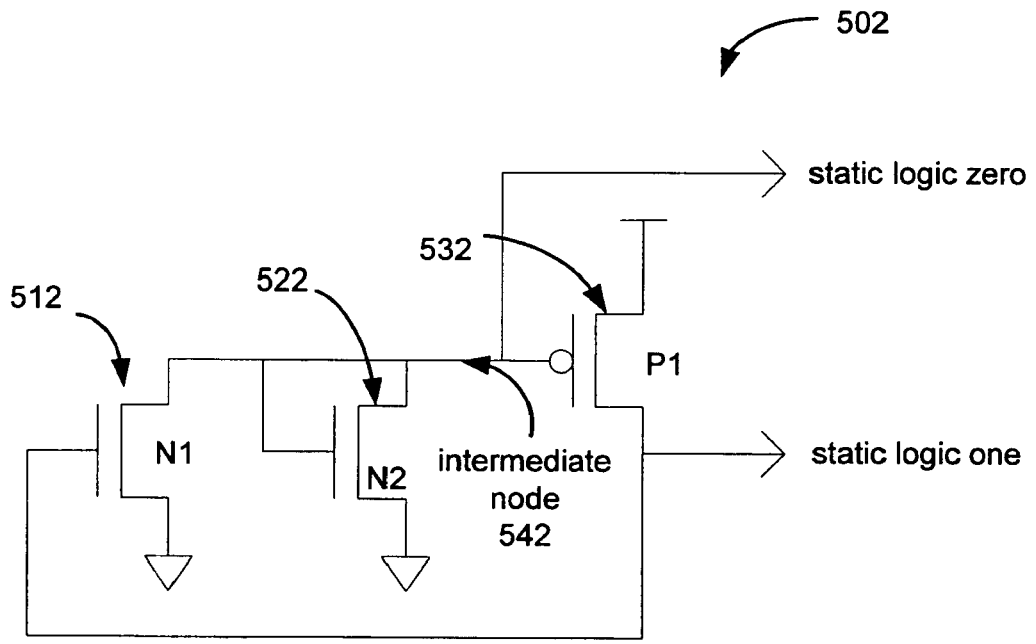
FIG. 5B shows one embodiment of a circuit to output a static logic one.

FIG. 5B illustrates an alternative embodiment of a circuit to generate a static logic zero and a static logic one. The circuit 502 includes a first NMOS transistor 512, a second NMOS transistor 522, and a pMOS transistor 532. The gate of the second NMOS transistor 522 is coupled to the drain of the second nMOS transistor 522 to form a diode. The gate of the second nMOS transistor 522 is further coupled to the gate of the pMOS transistor 532. The drain of the pMOS transistor 532 is coupled to the gate of the first nMOS transistor 512 and the source of the pMOS transistor 532 is coupled to a power supply. The drain of the first NMOS transistor 512 is coupled to the gates of the second NMOS transistor 522 and the pMOS transistor 532. The source terminals of the first and second nMOS transistors 512 and 522 are grounded.

In one embodiment, the first nMOS transistor 512 provides a positive feedback to the pMOS transistor 532. Furthermore, the diode-connected NMOS 522 may pull an intermediate node 542 below the logic one level. Advantages similar to those discussed above with respect to FIG. 5A may be provided by the positive feedback arrangement in the circuit 502 as well as the diode-connected nMOS transistor 522.

As illustrated by the exemplary embodiments described above, using either a latch or a feedback mechanism to generate static logic zero and/or static logic one may eliminate the high-impedance and non-CMOS level nodes, which are common in many conventional static logic level circuits. The elimination of the high-impedance node from the static logic level circuits reduces the likelihood of crosstalk. Furthermore, using either a latch or a feedback mechanism may not incur a large area penalty as using a resistor does in some conventional static logic level circuits.

The technique described above may be very valuable going forward once technology advances to the point where coupling a gate directly to a power supply or ground causes ESD failures (e.g., at about the 130 nm node). This is especially problematic with technologies which provides high device threshold voltages (Vt) relative to the power supply value. Unlike the diode connection in some conventional static logic level circuits, which requires the Field Effect Transistor (FET) device Vt to be low enough, the intermediate node in some embodiments of the present invention is always at a full logic zero or logic one level.

Figure 6A:
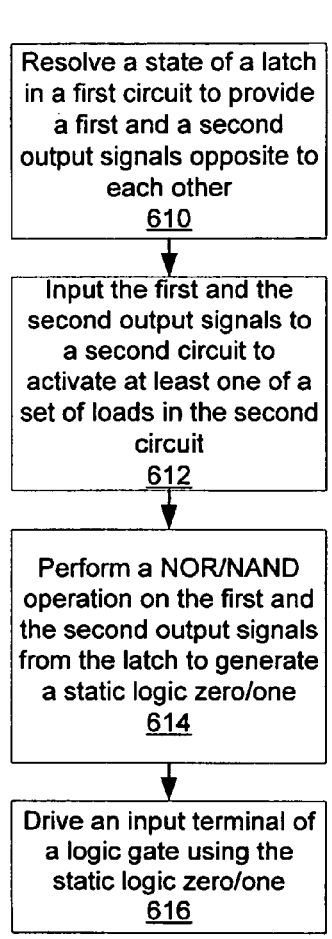
FIGS. 6A–6C show various embodiments of a process to generate a static logic level output.

FIG. 6A shows one embodiment of a process to generate a static logic level output, which may include a static logic one or a static logic zero. The process is performed by processing logic that may comprise hardware (e.g., circuitry, dedicated logic, etc.), software (such as is run on a general-purpose computer system, a server, or a dedicated machine), or a combination of both.

In one embodiment, processing logic resolves a state of a latch in a first circuit to provide a first and a second output signals that are opposite to each other (processing block 610). The first and the second output signals are input to a second circuit to activate at least one of a set of loads in the second circuit (processing block 612). Processing logic performs a NOR or a NAND operation on the first and the second output signals from the latch to generate a static logic zero or a static logic one, respectively (processing block 614). Then processing logic may drive an input terminal of a logic gate using the static logic zero or the static logic one generated (processing block 616). The input terminal of the logic gate may not be driven by any other driving devices. In some embodiments, the logic gate resides on a common IC substrate with the first and the second circuits.

Furthermore, processing logic may use the static logic one or static logic zero to drive an nMOS transistor or a pMOS transistor, respectively, in order to further generate a static logic zero or a static logic one, respectively. Alternatively, processing logic may use the static logic one or static logic zero to drive an inverter to further generate the opposite static logic level output.

Figure 6B:
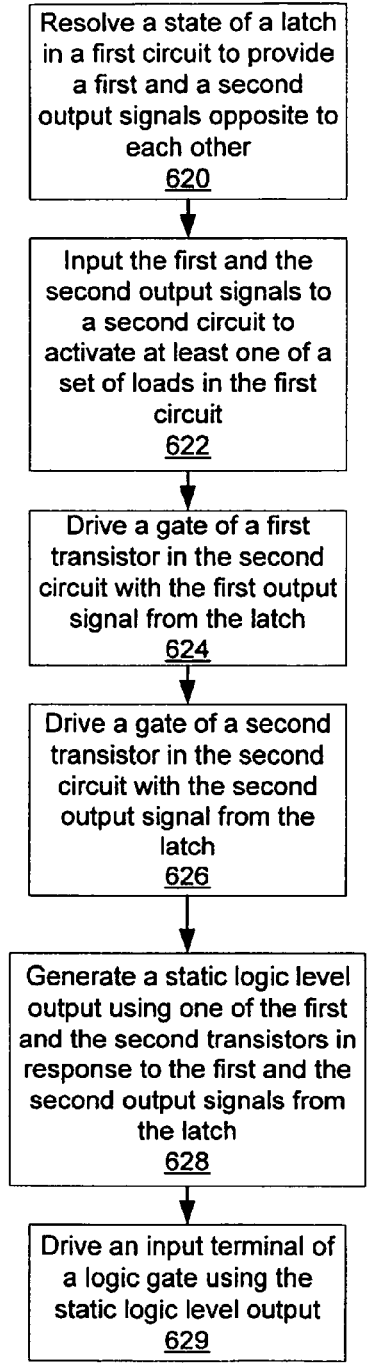

FIG. 6B shows an alternative embodiment of a process to generate a static logic level output, which may include a static logic one or a static logic zero. The process is performed by processing logic that may comprise hardware (e.g., circuitry, dedicated logic, etc.), software (such as is run on a general-purpose computer system, a server, or a dedicated machine), or a combination of both.

Processing logic resolves a state of a latch in a first circuit to provide a first and a second output signals that are opposite to each other (processing block 620). The first and the second output signals are input to a second circuit to activate at least one of a set of loads in the second circuit (processing block 622). Processing logic drives a gate of a first transistor in the second circuit with the first output signal from the latch (processing block 624). Processing logic also drives a gate of a second transistor in the second circuit with the second output signal from the latch (processing block 626). Processing logic generates a static logic level output using one of the first and the second transistors in response to the first and the second output signals from the latch (processing block 628). In some embodiments, processing logic drives an input terminal of a logic gate using the static logic level output generated (processing block 629). The input terminal of the logic gate may not be driven by any other driving devices. In some embodiments, the logic gate resides on a common integrated circuit substrate with the first and the second circuit.

Furthermore, processing logic may use the static logic one or the static logic zero to drive an nMOS transistor or a pMOS transistor, respectively, in order to further generate a static logic zero or a static logic one, respectively. Alternatively, processing logic may use the static logic one or static logic zero to drive an inverter to further generate the opposite static logic level output.

Figure 6C:
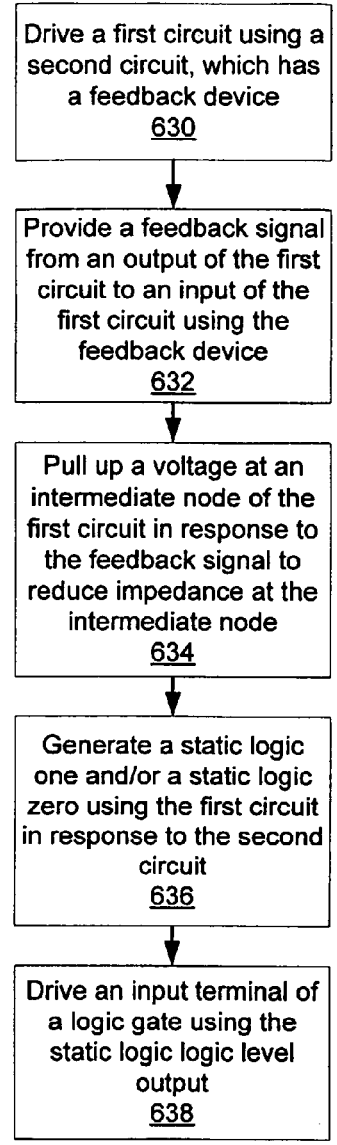

FIG. 6C shows an alternative embodiment of a process to generate a static logic level output, which may include a static logic one or a static logic zero. The process is performed by processing logic that may comprise hardware (e.g., circuitry, dedicated logic, etc.), software (such as is run on a general-purpose computer system, a server, or a dedicated machine), or a combination of both.

Processing logic drives a first circuit using a second circuit, which has a feedback device (processing block 630). Processing logic provides a feedback signal from an output of the first circuit to an input of the first circuit using the feedback device (processing block 632). Processing logic may pull up a voltage at an intermediate node of the first circuit in response to the feedback signal to reduce the impedance at the intermediate node (processing block 634). Processing logic may generate a static logic one and/or a static logic zero using the first circuit in response to the second circuit (processing block 636). Then processing logic may drive an input terminal of a logic gate using the static logic zero or the static logic one generated (processing block 638). The input terminal of the logic gate may not be driven by any other driving devices. In some embodiments, the logic gate resides on a common integrated circuit substrate with the first and the second circuit.

Figure 7:
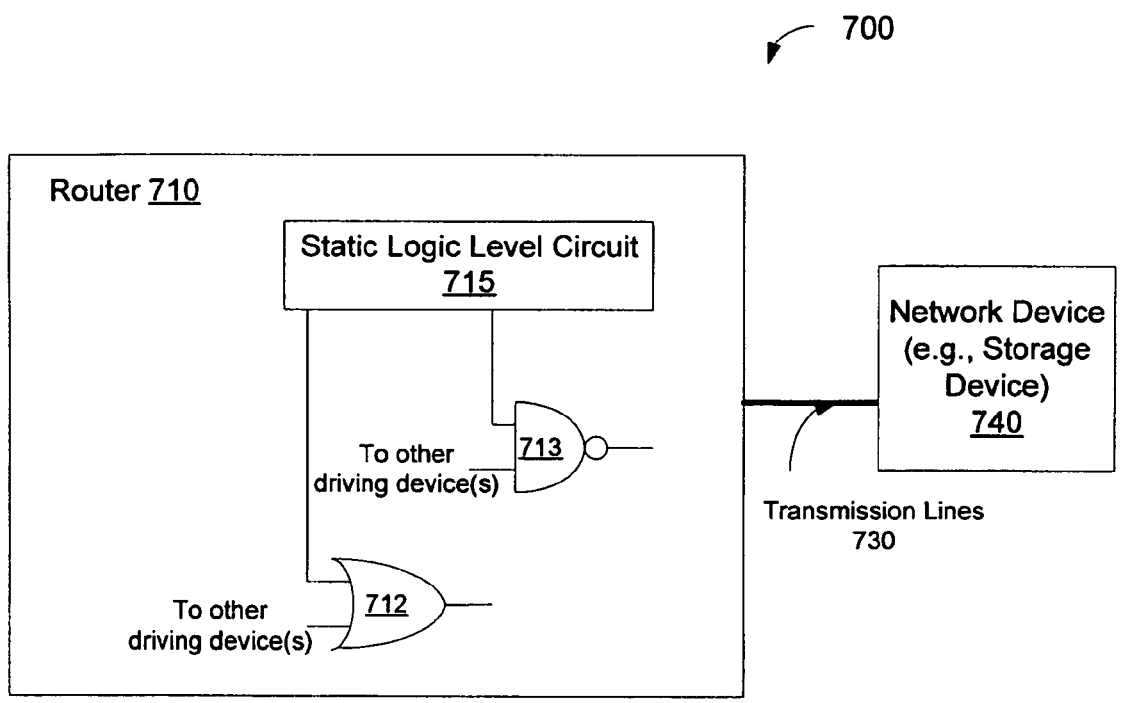
FIG. 7 shows an exemplary embodiment of a system usable with some embodiments of the invention.

FIG. 7 illustrates one embodiment of a networked system 700 usable with some embodiments of the invention. The networked system 700 includes a router 710, transmission lines 730, and a network device 740 (e.g., a storage device). The router 710 further includes a static logic level circuit 715. Input terminals of some logic gates in the router 710 (e.g., the NOR gate 712, the NAND gate 713, etc.) not driven by any other driving device in some logic gates in the router 710 may be coupled to the static logic level circuit 715, which provides a static logic one and/or a static logic zero to these input terminals. The transmission lines 730 couple the router 710 to the network device 740. Signals from the router 710 may propagate across the transmission lines 730 to the network device 740. Likewise, the router 710 receives signals from the network device 740 via the transmission lines 730. Some exemplary embodiments of the static logic level circuit 715 have been described above with reference to FIGS. 3A, 3B, 4A, 4B, 5A, and 5B.

Note that any or all of the components of the networked system 700 and associated hardware may be used in various embodiments of the present invention. However, it can be appreciated that other configurations of the networked system 700 may include additional or fewer components than those illustrated in FIG. 7.

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
   a first circuit comprising a static logic level output; and
   a second circuit coupled to the first circuit to drive the first circuit, the second circuit comprising a latch, wherein the latch comprises a first inverter and a second inverter each having an input and an output, wherein the input of the first inverter and the output of the second inverter are coupled to a first output node of the latch, and wherein the input of the second inverter and the output of the first inverter are coupled to a second output node of the latch, wherein the first circuit comprises a NOR gate having a first input directly coupled to the first output node of the latch and a second input directly coupled to the second output node of the latch, and wherein the NOR gate has a static logic zero output.

2. An apparatus, comprising:
   a first circuit comprising a static logic level output; and
   a second circuit coupled to the first circuit to drive the first circuit, the second circuit comprising a latch, wherein the latch comprises a first inverter and a second inverter each having an input and an output, wherein the input of the first inverter and the output of the second inverter are coupled to a first output node of the latch, and wherein the input of the second inverter and the output of the first inverter are coupled to a second output node of the latch, wherein the first circuit comprises a NAND gate having a first input directly coupled to the first output node of the latch and a second input directly coupled to the second output node of the latch, and wherein the NAND gate has a static logic one output.

3. An apparatus, comprising:
a first circuit comprising a static logic level output; and
a second circuit coupled to the first circuit to drive the first circuit, the second circuit comprising a latch, wherein the latch comprises a first inverter and a second inverter each having an input and an output, wherein the input of the first inverter and the output of the second inverter are coupled to a first output node of the latch, and wherein the input of the second inverter and the output of the first inverter are coupled to a second output node of the latch, wherein the first circuit comprises a first n-type Metal Oxide Semiconductor (nMOS) transistor and a second nMOS transistor, the first nMOS transistor comprising a first source coupled to a ground supply and a first gate coupled to the first output node of the latch, the second nMOS transistor comprising a second source coupled to the ground supply and a second gate coupled to the second output node of the latch, the first drain and the second drain being coupled together to output a static logic zero.

4. The apparatus of claim 3, further comprising:
a logic gate residing on a common integrated circuit substrate with the first and the second circuits, the logic gate comprising an input terminal coupled to the static logic level output of the first circuit, wherein the input terminal is not coupled to any other driving devices.

5. The apparatus of claim 4, further comprising:
a router comprising the logic gate, the first circuit, and the second circuit;
a plurality of transmission lines coupled to the router; and
a network component coupled to the router via the plurality of transmission lines, wherein the network component includes a storage device.

6. An apparatus, comprising:
a first circuit comprising a static logic level output; and
a second circuit coupled to the first circuit to drive the first circuit, the second circuit comprising a latch, wherein the latch comprises a first inverter and a second inverter each having an input and an output, wherein the input of the first inverter and the output of the second inverter are coupled to a first output node of the latch, and wherein the input of the second inverter and the output of the first inverter are coupled to a second output node of the latch, wherein the first circuit comprises a first p-type Metal Oxide Semiconductor (pMOS) transistor and a second pMOS transistor, the first pMOS transistor comprising a first source coupled to a power supply and a first gate coupled to the first output node of the latch, the second pMOS transistor comprising a second source coupled to the power supply and a second gate coupled to the second output node of the latch, the first drain and the second drain being coupled together to output a static logic one.

7. The apparatus of claim 6, further comprising:
a logic gate residing on a common integrated circuit substrate with the first and the second circuits, the logic gate comprising an input terminal coupled to the static logic level output of the first circuit, wherein the input terminal is not coupled to any other driving devices.

8. The apparatus of claim 7, further comprising:
a router comprising the logic gate, the first circuit, and the second circuit;
a plurality of transmission lines coupled to the router; and
a network component coupled to the router via the plurality of transmission lines, wherein the network component includes a storage device.

9. A method, comprising:
driving a first circuit using a second circuit comprising at least one of a latch and a feedback device;
generating a static logic level output using the first circuit in response to the second circuit;
resolving a state of the latch to provide a first and a second output signals, wherein the first and the second output signals are opposite to each other;
inputting the first and the second output signals to the first circuit to activate at least one of a plurality of loads in the first circuit, wherein the plurality of loads comprises a plurality of field effect transistor (FET) devices; and
the first circuit performing a NOR operation on the first and the second output signals from the latch to generate a static logic zero without directly coupling the first circuit to at least one of a power supply and a ground.

10. A method, comprising:
driving a first circuit using a second circuit comprising at least one of a latch and a feedback device;
generating a static logic level output using the first circuit in response to the second circuit;
resolving a state of the latch to provide a first and a second output signals, wherein the first and the second output signals are opposite to each other;
inputting the first and the second output signals to the first circuit to activate at least one of a plurality of loads in the first circuit, wherein the plurality of loads comprises a plurality of field effect transistor (FET) devices; and
the first circuit performing a NAND operation on the first and the second output signals from the latch to generate a static logic one without directly coupling the first circuit to at least one of a power supply and a ground.

11. A method, comprising:
driving a first circuit using a second circuit comprising at least one of a latch and a feedback device;
generating a static logic level output using the first circuit in response to the second circuit;
resolving a state of the latch to provide a first and a second output signals, wherein the first and the second output signals are opposite to each other;
inputting the first and the second output signals to the first circuit to activate at least one of a plurality of loads in the first circuit, wherein the plurality of loads comprises a plurality of field effect transistor (FET) devices;
driving a gate of a first n-type Metal Oxide Semiconductor (nMOS) transistor in the first circuit with the first output signal from the latch;
driving a gate of a second nMOS transistor in the first circuit with the second output signal from the latch; and
generating a static logic zero using one of the first nMOS transistor or the second nMOS transistor in response to the first and the second output signals from the latch.

12. A method, comprising:
driving a first circuit using a second circuit comprising at least one of a latch and a feedback device;
generating a static logic level output using the first circuit in response to the second circuit;
resolving a state of the latch to provide a first and a second output signals, wherein the first and the second output signals are opposite to each other;

inputting the first and the second output signals to the first circuit to activate at least one of a plurality of loads in the first circuit, wherein the plurality of loads comprises a plurality of field effect transistor (FET) devices;

driving a gate of a first p-type Metal Oxide Semiconductor (pMOS) transistor in the first circuit with the first output signal from the latch;

driving a gate of a second pMOS transistor in the first circuit with the second output signal from the latch; and generating a static logic one using one of the first pMOS transistor or the second pMOS transistor in response to the first and the second output signals from the latch.

13. An apparatus, comprising:

means for driving a first circuit using a second circuit comprising at least one of a latch and a feedback device;

means for generating a static logic level output using the first circuit in response to the second circuit;

means for resolving a state of the latch to provide a first and a second output signals, wherein the first and the second output signals are opposite to each other;

means for inputting the first and the second output signals to the first circuit to activate at least one of a plurality of loads in the first circuit, wherein the plurality of loads comprises a plurality of field effect transistor (FET) devices;

means for driving a gate of a first n-type Metal Oxide Semiconductor (nMOS) transistor in the first circuit with the first output signal from the latch;

means for driving a gate of a second nMOS transistor in the first circuit with the second output signal from the latch; and means for generating a static logic zero using one of the first NMOS transistor or the second nMOS transistor in response to the first and the second output signals from the latch.

14. An apparatus, comprising:

means for driving a first circuit using a second circuit comprising at least one of a latch and a feedback device;

means for generating a static logic level output using the first circuit in response to the second circuit;

means for resolving a state of the latch to provide a first and a second output signals, wherein the first and the second output signals are opposite to each other;

means for inputting the first and the second output signals to the first circuit to activate at least one of a plurality of loads in the first circuit, wherein the plurality of loads comprises a plurality of field effect transistor (FET) devices;

means for driving a gate of a first p-type Metal Oxide Semiconductor (pMOS) transistor in the first circuit with the first output signal from the latch;

means for driving a gate of a second pMOS transistor in the first circuit with the second output signal from the latch; and means for generating a static logic one using one of the first pMOS transistor or the second pMOS transistor in response to the first and the second output signals from the latch.

* * * * *